United States Patent [19]

Slemmons et al.

[11] Patent Number: 5,076,486

[45] Date of Patent: Dec. 31, 1991

[54] BARRIER DISK

[75] Inventors: John W. Slemmons, Orange; Francis J. Woolston, Santa Ana; Patrick J. Redmond, Fullerton, all of Calif.

[73] Assignee: Rockwell International Corporation, El Segundo, Calif.

[21] Appl. No.: 597,958

[22] Filed: Oct. 15, 1990

Related U.S. Application Data

[62] Division of Ser. No. 316,740, Feb. 28, 1989, abandoned.

[51] Int. Cl.$^5$ .............................................. B23K 31/02
[52] U.S. Cl. ..................................... 228/179; 228/44.7
[58] Field of Search ............... 228/179, 110, 111, 123, 228/44.7 X, 1.1; 437/189, 190, 194, 196

[56] References Cited

U.S. PATENT DOCUMENTS

| | | | |
|---|---|---|---|
| 3,111,741 | 11/1963 | Allen et al. ........................ | 228/179 |
| 3,531,852 | 10/1970 | Slemmons et al. ................. | 228/110 |
| 3,537,174 | 11/1970 | May .................................... | 228/123 |
| 3,544,704 | 12/1970 | Glenn, Jr. et al. ................. | 174/256 |
| 3,689,232 | 9/1972 | Makoto et al. ..................... | 428/651 |
| 4,073,426 | 2/1978 | Devine, Jr. ......................... | 228/179 |
| 4,086,375 | 4/1978 | LaChapelle, Jr. et al. ......... | 437/209 |
| 4,210,389 | 7/1980 | Burkhart et al. ................... | 228/122 |
| 4,321,617 | 3/1982 | Duda et al. ......................... | 228/123 |
| 4,330,343 | 5/1982 | Christou et al. .................... | 437/22 |
| 4,687,541 | 8/1987 | Penney ............................... | 156/643 |
| 4,742,023 | 5/1988 | Hasegawa .......................... | 437/183 |
| 4,772,935 | 9/1988 | Lawler et al. ...................... | 228/123 |
| 4,866,505 | 9/1989 | Roberts et al. ..................... | 357/71 |
| 4,907,734 | 3/1990 | Conru et al. ....................... | 228/110 |

FOREIGN PATENT DOCUMENTS

| | | |
|---|---|---|
| 1279399 | 11/1961 | France . |
| 128280 | 10/1979 | Japan . |
| 1198257 | 7/1970 | United Kingdom . |
| 1360213 | 7/1974 | United Kingdom . |

OTHER PUBLICATIONS

"Enhanced Aluminum Wire Bond Process" IBM Technical Discl. Bulletin (1987) Dec., No. 7, Armonk, N.Y., U.S.A.; p. 279, vol. 30.

Primary Examiner—Richard K. Seidel
Assistant Examiner—Chuck Y. Mah
Attorney, Agent, or Firm—Fredrick Hamann; George A. Montanye; Tom Streeter

[57] ABSTRACT

An aluminum foil has, sputtered upon it, a foil of tungsten, upon which a foil of gold is sputter deposited. The gold foil may be placed next to a gold substrate, and the three-foil combination bonded to the substrate with a stylus, upon which ultrasound is impressed, in the presence of a moderately elevated temperature. An aluminum region the size of the tip of the stylus is thus made available for an aluminum wire to be bonded to it, without any direct contact between the aluminum wire and the gold substrate.

6 Claims, 6 Drawing Sheets

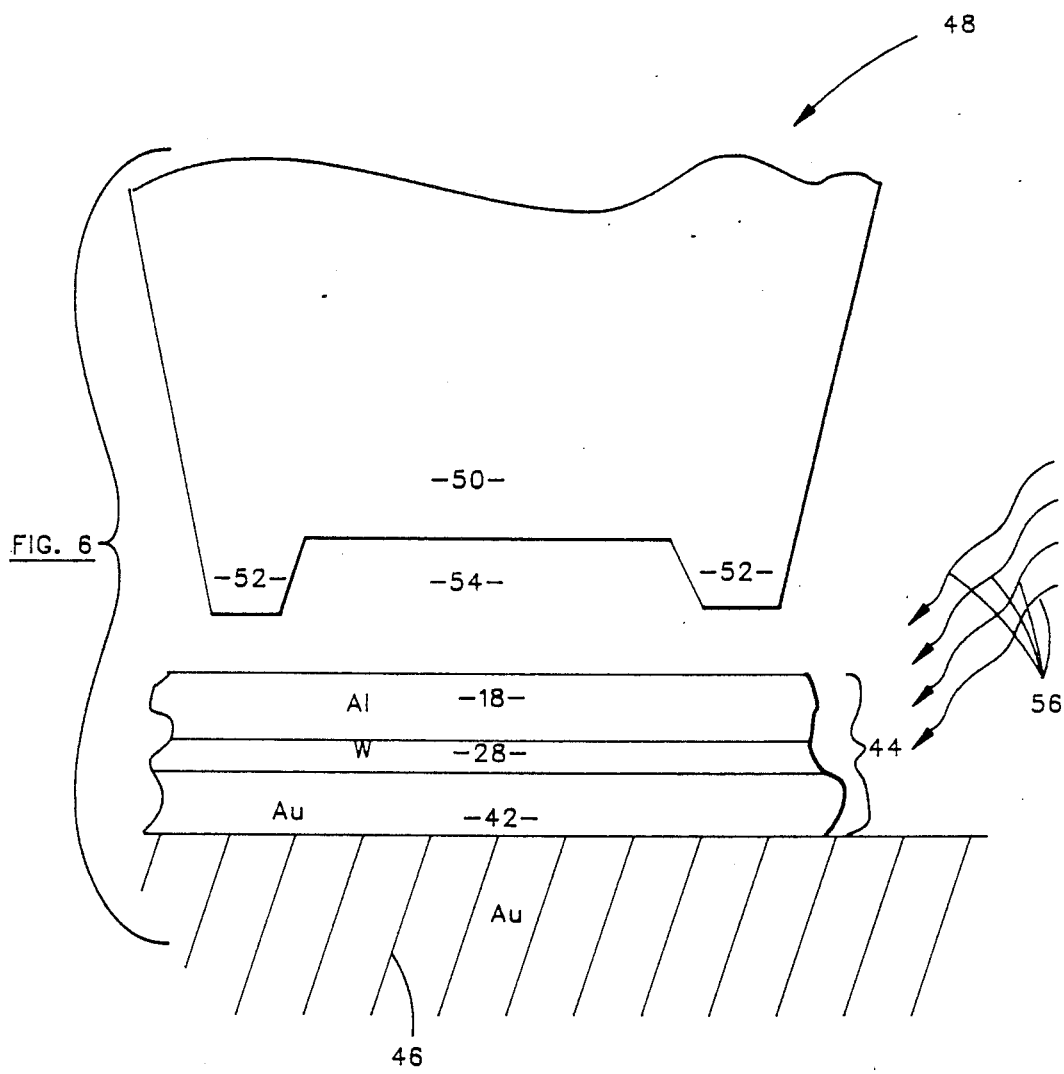

BARRIER DISK

This is a divisional application of copending application Ser. No. 07/316,740 filed on Feb. 28, 1989, now abandoned.

TECHNICAL FIELD

This invention relates to apparatus and methods for bonding a wire to a substrate, the wire and the substrate consisting of different materials, and has particular reference to bonding a wire to a substrate in such a fashion as to maintain good electrical conductivity between the wire and the substrate, and as to maintain this electrical conductivity in the presence of adverse environmental conditions.

BACKGROUND ART

Semiconductor chips are generally formed with aluminum metallization. The boards upon which they are mounted, however, generally have conductive paths screened on them which are essentially made of gold. When a chip needs to be connected to a substrate on the board, it is necessary to have an aluminum/gold interface. When this happens, the aluminum and the gold react with each other, especially at higher temperatures. This causes two problems. First, the resistance of the junction becomes excessively great. Second, the mechanical strength of the junction becomes excessively small, allowing the wire to work loose and cause an open circuit under forces which must be anticipated in its operating environment, and which would not cause such an open circuit if the junction were stronger.

Two possible solutions to this problem are to make an entirely aluminum apparatus, or an entirely gold apparatus. The former is not satisfactory, since the aluminum tracings on the board react with moisture and other environmental conditions, and rapidly attain an excessively higher resistance. The latter is equally unsatisfactory, if for no other reason than excessive cost.

SUMMARY OF THE INVENTION

It is an objective of the present invention to overcome these problems by providing a bonding region to be bonded to a substrate consisting of a first material. The bonding region comprises three foils. The first foil is bonded to the substrate, and consists of a second material which is nonreactive with the first material. The second foil is bonded to the first foil, and consists of a third material which is nonreactive with the second material. The third foil is bonded to the second foil, and consists of a fourth material which is nonreactive with the third material. The wire to be bonded to the substrate consists of a fifth material which is reactive with the first material, but is nonreactive with the fourth material.

Two materials are "reactive" within the meaning of the present invention if they are sufficiently reactive as to cause a juncture between the materials to exceed a design limitation, such as resistance or strength; they are "nonreactive" if they do not.

In one embodiment of the present invention, each of the first and second materials comprises a first common element, and each of the fourth and fifth materials comprises a second common element. This first common element preferably comprises gold, and the second common element preferably comprises aluminum. Alternatively, the first common element may comprise aluminum, and the second common element comprise gold. This would be appropriate in the comparatively rare situation in which a gold wire is to be attached to an aluminum substrate.

The middle, second foil, which consists of a material which is nonreactive with both the first foil and with the third foil, may be made of a material comprising tungsten, nichrome, nickel, or platinum.

Such a bonding region may conveniently be formed by bonding together the first foil, the second foil, and the third foil (disposing the second foil between the first and third foils), and then bonding the first foil to the substrate. The composition of the foils, the substrate, and the wire, is as described in the foregoing summary of the apparatus. A suitable method of bonding together the first and second foils comprises sputter deposition, either of the first foil upon the second, or the second foil upon the first. Likewise, sputter deposition may be used to bond the second foil onto the third, or the third onto the second.

Once such a three-foil combination has been formed, it may be conveniently bonded to the substrate by facing the first foil to the substrate and then placing the bonded together first, second, and third foils on the substrate. Alternatively, the bonded together foils may be placed, not on, but sufficiently close to the substrate that the foils maintain their integrity if they are pressed to the substrate in a region sufficient large as to accommodate the subsequent bonding of the wire to the third foil, but no larger. Once situated in this position, the foils are pressed to the substrate in a region sufficiently large as to accommodate the subsequent bonding of the wire to the third foil, and sufficient force is applied to the region of the foils as to bond the first foil to the substrate. The foils exclusive of the bond region may then be removed from the substrate.

The bonding process ideally takes place at an elevated temperature, and includes the application of ultrasound to the region of the foils, or both. Such ultrasound may conveniently applied to the foils through a stylus pressing the region of the foils to the substrate.

It is a feature of the present invention that the foils may readily be bonded to one another before the foil combination is bonded to the substrate or the wire.

It is an advantage of the present invention that the foil combination may be produced under conditions which might adversely affect the substrate, the board upon which the substrate rests, the wire, or the chip to which the wire leads.

BRIEF DESCRIPTION OF THE DRAWINGS

FIG. 4a shows bombardment of the tungsten target. FIG. 4b shows reversal of the tungsten and gold targets. FIG. 4c shows bombardment of the gold target.

FIG. 6 is a vertical cross section of the three-foil combination, positioned to be bonded to the gold substrate by a stylus.

PREFERRED EMBODIMENT FOR CARRYING OUT THE INVENTION

Figure 2:
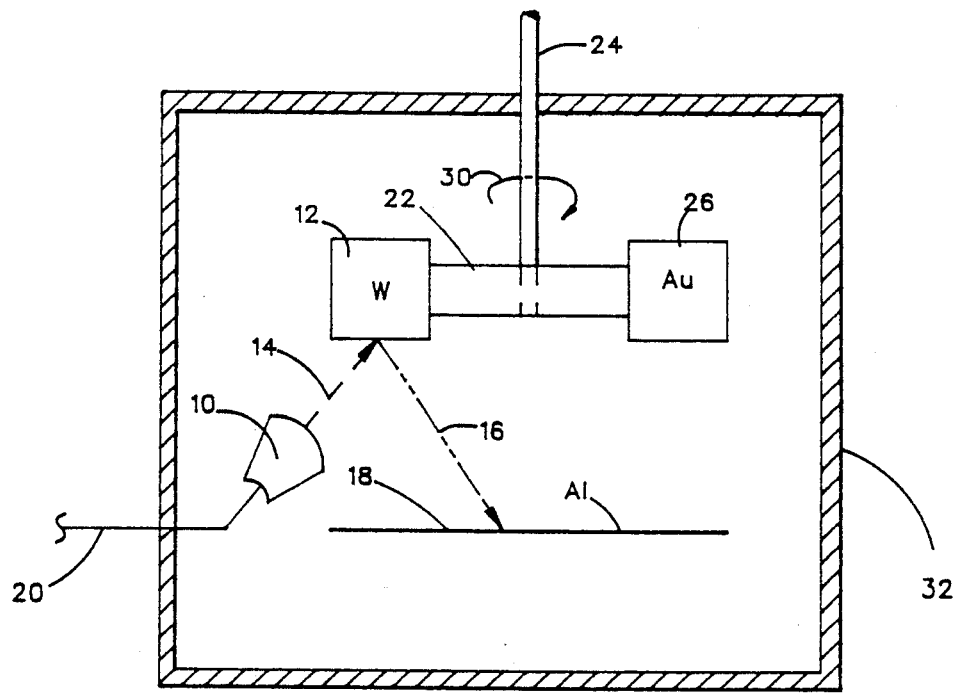
FIG. 2 is a vertical cross section, partly schematic, of apparatus for sputter depositing tungsten and gold on an aluminum foil, taken along the line 2—2 shown in FIG. 1.
Figure 1:
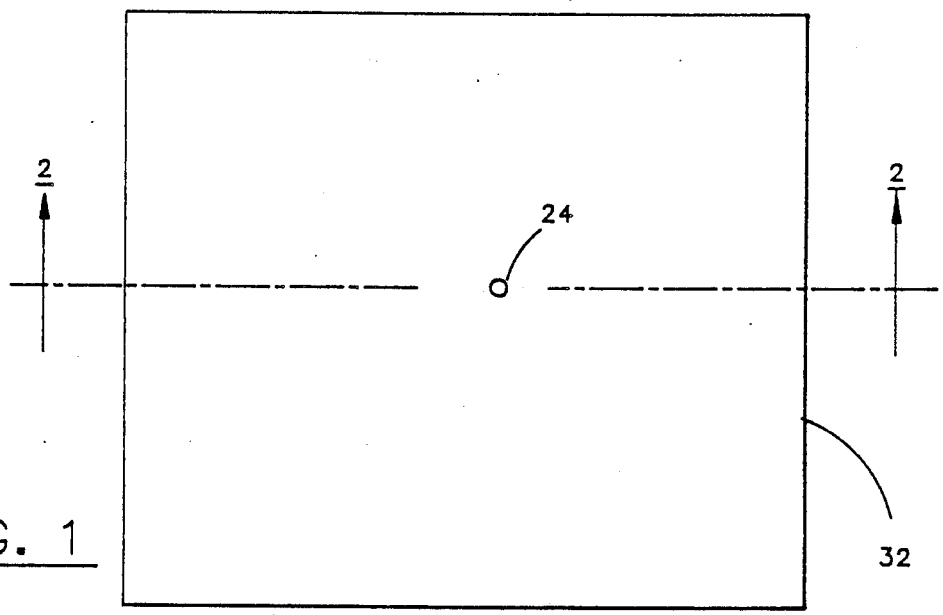
FIG. 1 is a top plan view of a vacuum chamber in which the three-foil combination is formed by sputter deposition.
Figure 3:
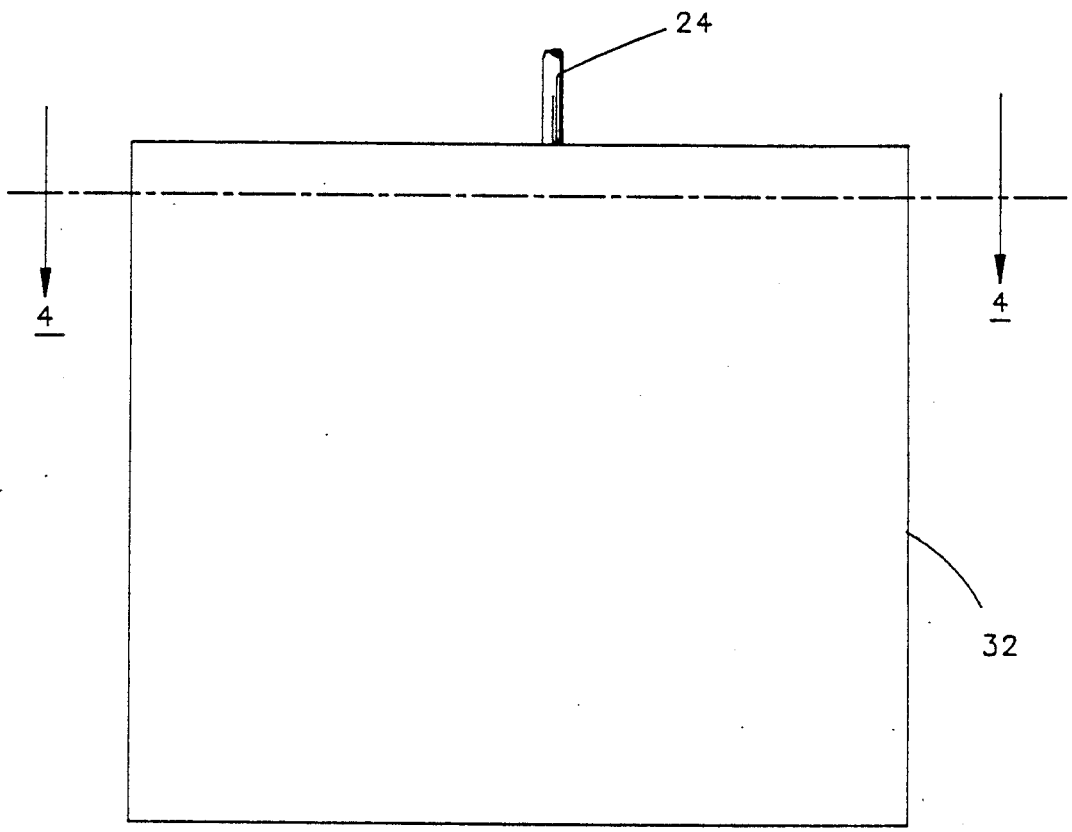
FIG. 3 is a side elevation of the vacuum chamber shown in FIG. 1.

Turning now to FIG. 2, sputter deposition takes place between an anode 10 and a tungsten cathode 12. Heavy ions 14 bombard the cathode 12, and sputter deposit tungsten atoms 16 upon an aluminum foil 18. Power is supplied to the anode 10 through a wire 20. As the ions 14 fall upon the cathode 12 and release their charge, the charge is removed from the cathode 12 by a horizontal support 22, which is connected both electrically and mechanically with a vertical support 24. The excess charge falling upon the cathode 12 is therefore withdrawn along horizontal support 22 and vertical support 24.

Figure 4A:
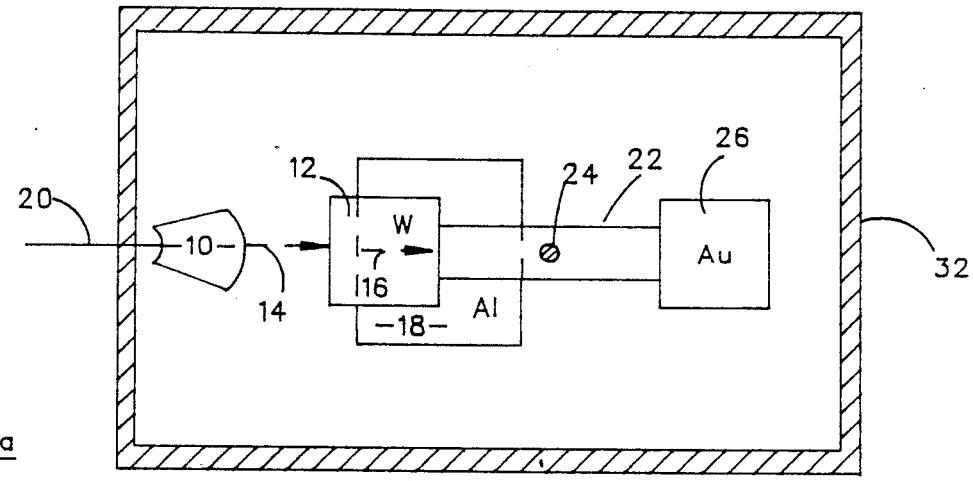
FIGS. 4a, 4b, and 4c are top plan views of the vacuum chamber shown in FIG. 3, taken along the line 4—4 shown in FIG. 3.

The tungsten cathode 12 may be rotated away from the trajectory of the ions 14, and a gold cathode 26 may be placed in the trajectory of the ions 14 in the place of the tungsten cathode 12. This is best seen in FIG. 4a, which shows a top plan view of the ions 14 bombarding the tungsten target 12, with the tungsten atoms 16, blocked from view by the tungsten target 12, being shown in phantom line.

Figure 4B:
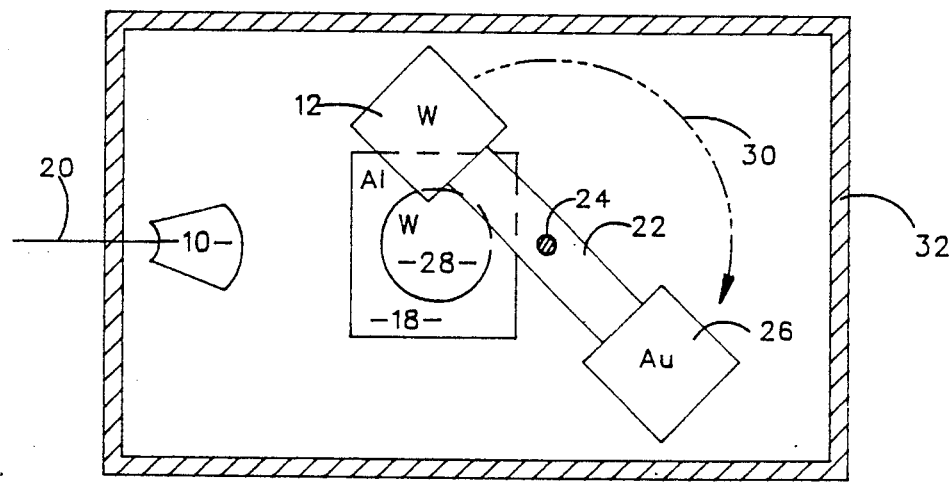
Figure 4C:
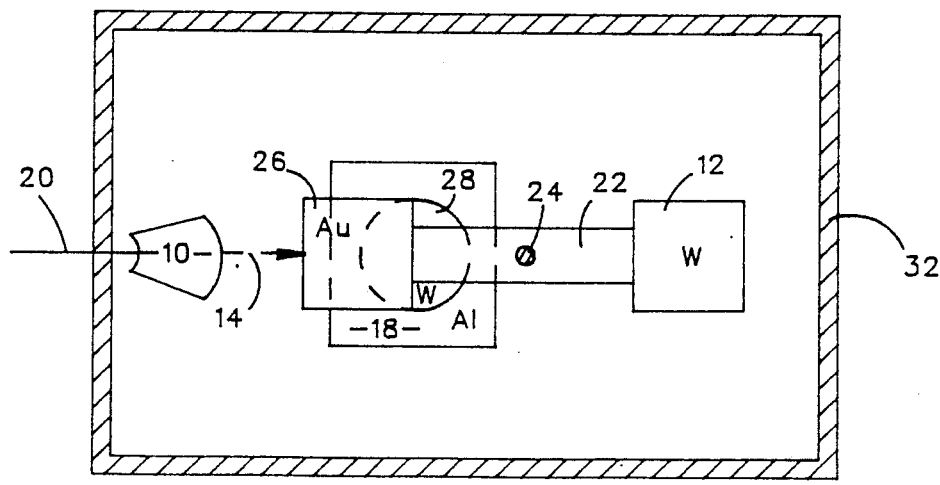

When a sufficiently thick layer 28 of tungsten has formed on the aluminum foil 18, power is withdrawn from the wire 20 and vertical support 24, and the horizontal support 22 is rotated by the vertical support 24 so as to place the gold cathode 26 in the trajectory of the ions 14 (FIG. 4b). The power is then turned back on, and gold is deposited over the tungsten layer 28 (FIG. 4c). In FIG. 4b, the direction of rotation of the horizontal bar 22 is shown by the arrow 30, although either direction may be used.

The apparatus is maintained within a vacuum vessel 32, so that air will not interfere with the path of the ions 14 or of the tungsten atoms 16 (FIG. 4a) or of the gold atoms 34 (FIG. 4c). Placing both targets 12, 26 within a single vacuum vessel 32 allows the entire three-foil structure to be produced without breaking the vacuum to change targets.

Figure 5:
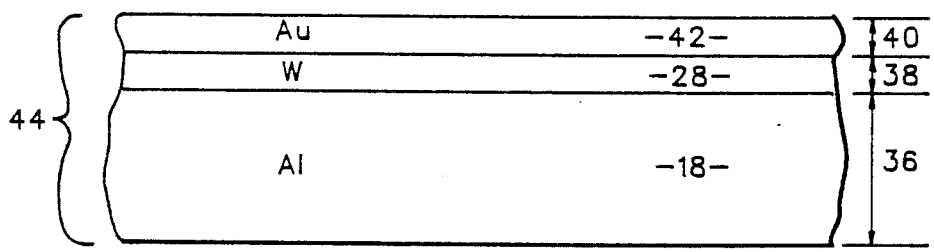
FIG. 5 is a vertical cross-sectional schematic representation of the aluminum foil with the tungsten and gold foils sputter deposited on it.

As shown in FIG. 5, the aluminum foil 18 has a thickness 36 which is greater than the thickness 38 of the tungsten sputter deposited layer 28, or the thickness 40 of the gold sputter deposited layer 42. Applicants prefer to use a 7 mil (0.007 inch) aluminum foil 18, a 1,500 Å unit tungsten layer 28, and a 5,000 Å unit gold layer 42. The tungsten 28 need only be thick enough to prevent reaction between the gold 42 and the aluminum 18. As tungsten is a fairly brittle metal, excess thickness is not desired.

It is apparent from the foregoing dimensions that FIG. 5 is not drawn to scale, but is an essentially schematic representation of the three-foil combination, drawn to maximize comprehension of the present invention.

Aluminum is used as the foil upon which the tungsten and gold are sputter deposited because it is cheap and easily worked. Other materials with these characteristics, and with the appropriate nonreactivity, may also be used.

Similarly, it is not required that the foil which bonds to the wire be the foil upon which the others are sputter deposited. In applications other than the embodiment shown herein, it may be more advantageous for the central foil to be the one upon which the others are sputter deposited, one on each side, or for the foil which bonds to the substrate to be the one upon which the others are sputter deposited.

The gold, tungsten, and aluminum foils 42, 28, 18 form a three-foil combination 44, which, after being removed from the vacuum vessel 32, is then inverted and placed over a gold substrate 46. The inversion is performed to assure that the gold layer 42 faces the gold substrate 46, while the aluminum layer 18 will face upward. As shown in FIG. 6, a stylus 48 is positioned to press the three-foil combination 44 against the substrate 46. The point 50 of the stylus 48 has a protruding circular rim 52, and a circular central recess 54.

The three-foil combination 44 and substrate 46 are then heated, preferably to around 150 C., with energy 56.

Figure 7:
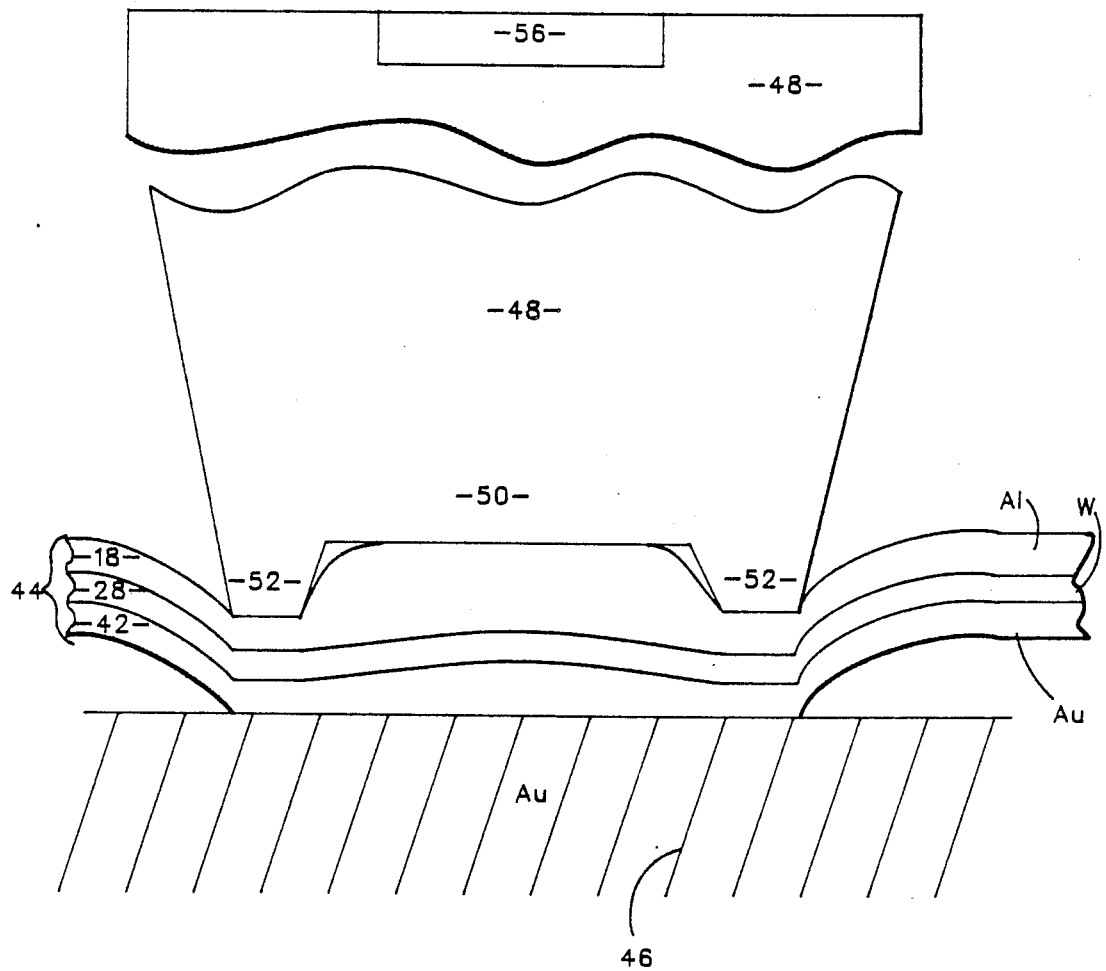
FIG. 7 is a vertical cross section of the stylus bonding the three-foil combination to the substrate.
Figure 8:
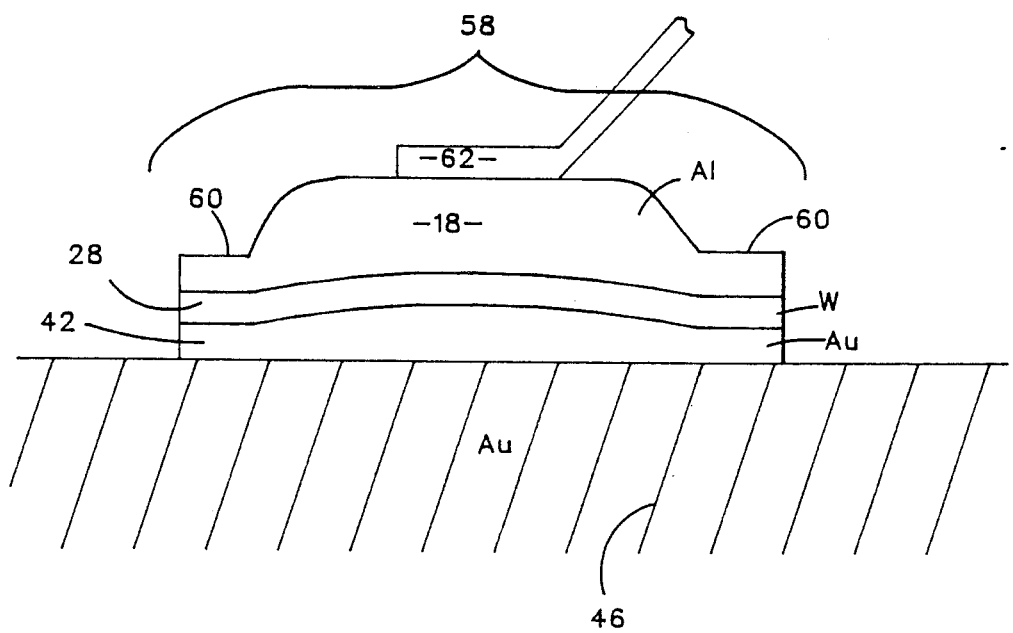
FIG. 8 is a vertical cross section of the bond region remaining on the substrate after the stylus, and the portion of the foil exclusive of the bond region, have been removed.

Turning now to FIG. 7, the stylus 48 presses the three-foil combination 44 against the substrate 46. The three-foil combination 44 is maintained close enough to the substrate 46 that the combination 44 maintains its integrity as it is pressed against the substrate 46. Once pressed against the substrate 46, the three-foil combination 44 is subjected to ultrasound transmitted through the stylus 48 from a piezoelectric crystal 56. The combination of the ultrasound, preferably at about 60 kHz, with the elevated temperatures causes the region 58 (see FIG. 8) of the three-foil combination 44 to bond to the gold substrate 46. This bond region 58 may also be called a barrier disk.

The recess 54 in the tip 50 of the stylus 48 (FIG. 6) is sufficiently shallow that sufficient force is applied even to the center of the region 58 as to bond it to the substrate 46. At the same time, the recess 54 is not so shallow that the rim 52 is unable to bond the edge 60 (FIG. 8) of the region 58 even more tightly to the substrate 46, and, more importantly, to so compress the edge 60 as to weaken it. Once weakened, the three-foil combination 44 will tear at the edge 60, and may be removed while leaving the bond region 58 still firmly bonded to the substrate 46. The stylus 48 may be removed before, concurrently with, or after, the removal of the three-foil combination 44.

The invention is now complete. An aluminum wire 62 may now be bonded to the aluminum foil portion 18 of the bond region 58.

The tungsten layer 28 may be replaced with a comparable layer of nichrome, nickel, platinum, or any other conductive material which does not react with either aluminum or gold. Likewise, the aluminum layer 18 may be replaced with a layer of any other composition which does not react with the wire 62. This replacement will be especially appropriate if the composition of the wire 62 is changed. Similarly, the gold layer 42 may be replaced with a layer of any other material which does not react with the substrate 46. As with the wire 62, this replacement will be especially appropriate if the composition of the substrate 46 is changed. If either or both substitutions are made, the tungsten layer 28 may have to be replaced by a layer of some other material which does not react with either the layer 18 interfacing with the wire 62, or the layer 42 interfacing with the substrate 46.

The radius of the barrier disk 58 thus formed should be large enough to accommodate the wire 62, but should not be much larger, or excessive portions of the substrate 46 will be covered. If desired, however, the barrier disk 58 may be made large enough to accommodate several wires 62, rather than providing a separate disk 58 for each wire 62.

Once chips have been bonded to a board, and the gold substrate 46 screened onto the board, the connection of the chips to the substrate may be readily automated. The three-foil combination 44 may be stretched across the entire board, and the board and the foil heated to the desired temperature. The stylus 48 may then be successively pressed against the substrate, and a brief burst of ultrasound applied to the stylus 48, in the desired locations. When barrier disks 58 have been formed at all the desired locations, the foil combination 44, with as many holes in it as there are barrier disks 58, may then be removed. Aluminum wires 62 may then be bonded between the aluminum metallized chips and the barrier disks 58 using any convenient technology.

INDUSTRIAL APPLICABILITY

The present invention is capable of exploitation in industry, and may be used, whenever it is desired to bond a wire to a dissimilar substrate. It may be made by bonding together foils of any three suitably nonreactive material, wherein the nonreactivity is both with respect to the foil or foils which each foil contacts, and with respect to the wire or substrate, as appropriate.

While a particular embodiment of the present invention has been described above, the true spirit and scope of the present invention is not defined thereby, but by the claims which are appended hereto.

What is claimed is:

1. A method for forming a region for bonding a wire to a substrate, the substrate consisting of a first material, the method comprising:
    (a) bonding together a first foil, a second foil, and a third foil,
        the second foil being disposed between the first foil and the third foil,
        the first foil consisting of a second material which is nonreactive with the first material,
        the second foil consisting of a third material which is nonreactive with the second material, and
        the third foil consisting of a fourth material which is nonreactive with the third material;
    (b) facing the first foil to the substrate;
    (c) placing the bonded together first, second, and third foils on the substrate or close to the substrate so that the foils maintain their integrity if they are pressed to the substrate;
    (d) pressing the foils to the substrate in a region sufficiently large as to accommodate the subsequent bonding of the wire to the third foil;
    (e) applying sufficient force to region of the foils as to bond the first foil to the substrate; and
    (f) removing the foils from the substrate exclusive of the bond region;
the wire consisting of a fifth material which is reactive with the first material, but nonreactive with the fourth material.

2. The method of claim 1, further comprising the step elevating the temperature of the substrate, the region of the foils, or both the substrate and the region of the foils.

3. The method of claim 1, further comprising the step of applying ultrasound to the region of the foils.

4. The method of claim 3, wherein the ultrasound is applied to the foils through a stylus pressing the region of the foils to the substrate.

5. The method of claim 3, further comprising the step elevating the temperature of the substrate, the region of the foils, or both the substrate and the region of the foils.

6. The method of claim 5, wherein the ultrasound is applied to the foils through a stylus pressing the region of the foils to the substrate.

* * * * *